United States Patent
Khawand et al.

(10) Patent No.: US 7,039,379 B2
(45) Date of Patent: May 2, 2006

(54) METHOD FOR MAINTAINING AUTOMATIC GAIN CONTROL SETTINGS FOR A MULTI-FREQUENCY COMMUNICATION DEVICE

(75) Inventors: Charbel Khawand, Miami, FL (US); Jean Khawand, Miami, FL (US); Michael A. Heck, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 486 days.

(21) Appl. No.: 10/108,132

(22) Filed: Mar. 27, 2002

(65) Prior Publication Data
US 2003/0220085 A1    Nov. 27, 2003

(51) Int. Cl.
*H04B 7/00* (2006.01)

(52) U.S. Cl. .................. 455/234.1; 455/242.1

(58) Field of Classification Search ........... 455/230, 455/231, 232.1, 242.1, 242.2, 234.1, 234.2, 455/245.1, 245.2; 375/345
See application file for complete search history.

(56) References Cited

U.S. PATENT DOCUMENTS

| | | | | |
|---|---|---|---|---|
| 4,852,086 A | * | 7/1989 | Eastmond et al. | 370/343 |
| 5,331,638 A | * | 7/1994 | Honkasalo et al. | 370/347 |
| 5,960,335 A | * | 9/1999 | Umemoto et al. | 455/226.2 |
| 6,477,389 B1 | * | 11/2002 | Kim | 455/522 |
| 6,563,891 B1 | * | 5/2003 | Eriksson et al. | 375/345 |
| 2001/0048727 A1 | * | 12/2001 | Schmutz et al. | 375/345 |
| 2002/0032013 A1 | * | 3/2002 | Pinola et al. | 455/136 |
| 2002/0122513 A1 | * | 9/2002 | Oksala et al. | 375/345 |

* cited by examiner

Primary Examiner—Sonny Trinh
Assistant Examiner—Sam Bhattacharya
(74) Attorney, Agent, or Firm—Scott M. Garrett

(57) ABSTRACT

In time divisioned, multi-frequency communication air interfaces it is common for a control channel to be defined on a first frequency while traffic channels are carried on other frequencies. A mobile communication device maintains the automatic gain control (AGC) settings for a first frequency while engaged on a second frequency by adjusting the AGC of the first frequency to correspond with changes in the AGC setting for the second frequency before attempting to access the first frequency again. Since, in the communication system, the two signals are transmitted from the same point, the changes in signal level will typically be similar enough that the mobile communication device will not have to perform a new AGC determination when switching back to the first frequency.

6 Claims, 2 Drawing Sheets

METHOD FOR MAINTAINING AUTOMATIC GAIN CONTROL SETTINGS FOR A MULTI-FREQUENCY COMMUNICATION DEVICE

TECHNICAL FIELD

This invention relates in general to wireless mobile communications, and more particularly to mobile communications in which a mobile communication device must periodically access channels on two different frequencies, such as a control channel and a traffic channel, and where the mobile communication device must maintain gain control for each channel.

BACKGROUND OF THE INVENTION

Mobile wireless communications systems are in widespread use throughout metropolitan centers of the world. These systems typically employ a control scheme where control information is transmitted on one frequency or one frequency band while another frequency band is used for traffic channels. One frequency is used to set up a call, and another frequency is used to carry out the actual call. This requires the mobile communication device to change frequencies periodically during a call. Part of the returning process is setting the automatic gain control setting of the receiver so that data can be properly decoded. For example, consider a system in accordance with the Global System for Mobile (GSM) Communications specification. The GSM specification requires frequency accuracy of 0.1 part per million. To accomplish the automatic frequency correction (AFC) the mobile communication device receives frequency correction bursts (FCB) on a control channel periodically. In order to correctly receive the FCB, the AGC must be set correctly, or the signal may be too attenuated by the receiver, or not attenuated enough resulting in clipping. While the mobile communication device is engaged in a call and using a traffic channel, the period between AFC/FCB events can extend to about 2.5 seconds. During that time the control channel gain is typically not adjusted, and significant events may occur causing a substantial change in the signal strength for which the mobile communication device cannot correct in time to receive a good FCB. The prior art method of handling this is to simply ignore the traffic channel and perform a full synchronization when accessing the control channel, including a new AFC determination. This prior art method typically results in a brief loss of signal on the traffic channel, however. Therefore there is a need for a means of accessing the control channel on a different frequency from a traffic channel presently employed for communication where the FCB can be more reliably received.

DETAILED DESCRIPTION OF A PREFERRED EMBODIMENT

Figure 1:
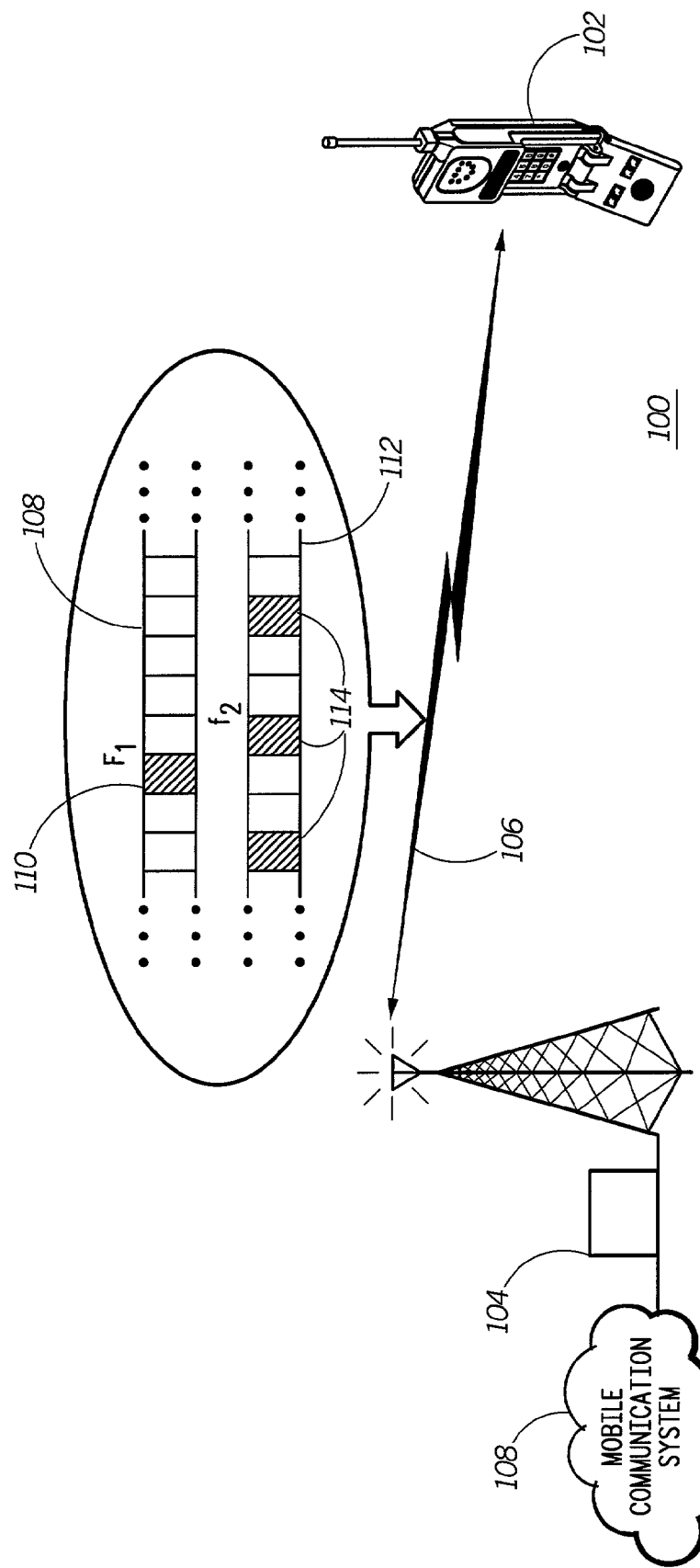
FIG. 1 shows a system diagram of a mobile communication system.

While the specification concludes with claims defining the features of the invention that are regarded as novel, it is believed that the invention will be better understood from a consideration of the following description in conjunction with the drawing figures, in which like reference numerals are carried forward. A brief description of the prior art is also thought to be useful.

The invention solves the problem of having the signal level of an first signal on a first frequency change while monitoring a second signal on a second frequency by tracking the changes in signal level of the second signal, and proportionately adjusting the automatic gain setting corresponding to the first signal before re-tuning to the first frequency.

Referring now to FIG. 1, there is shown a system diagram 100 of a mobile communication system, as is known in the art. A mobile communication device 102 communicates with a base station 104 over an air interface 106. The base station is connected to a mobile communications network 108. The air interface prescribes control channels by defining a first frequency 108, in which control information is transmitted by the base station in specified time slots 110. Traffic channels are established on a different frequency or frequency band 112, and by specified time slots 114. Typically there are additional frequency bands for establishing other channels, such as, for example, random access channels for the mobile communication device 102 to transmit information to the base station, and there are typically several frequency bands used to for traffic channels which are assigned in pairs for providing duplex communication. Inbound traffic is carried on one frequency while out bound traffic is carried on a different frequency. The time slots used for inbound and outbound traffic are offset in time so as to allow the mobile communication device to transmit and receive at different times, as is well practiced in the art. Therefore the mobile communication device receives information on one of the frequencies used for traffic such as voice content, and on a second frequency used for control information. When engaged in a call, the mobile communication device is monitoring the traffic channel it has been assigned to for receiving information, and tunes its receiver to that frequency. During a call the mobile communication device maintains an automatic gain control (AGC) setting. As the received signal level changes, the AGC setting is changed in correspondence to maintain a desired signal level in the receiver of the mobile communication device.

Figure 2:
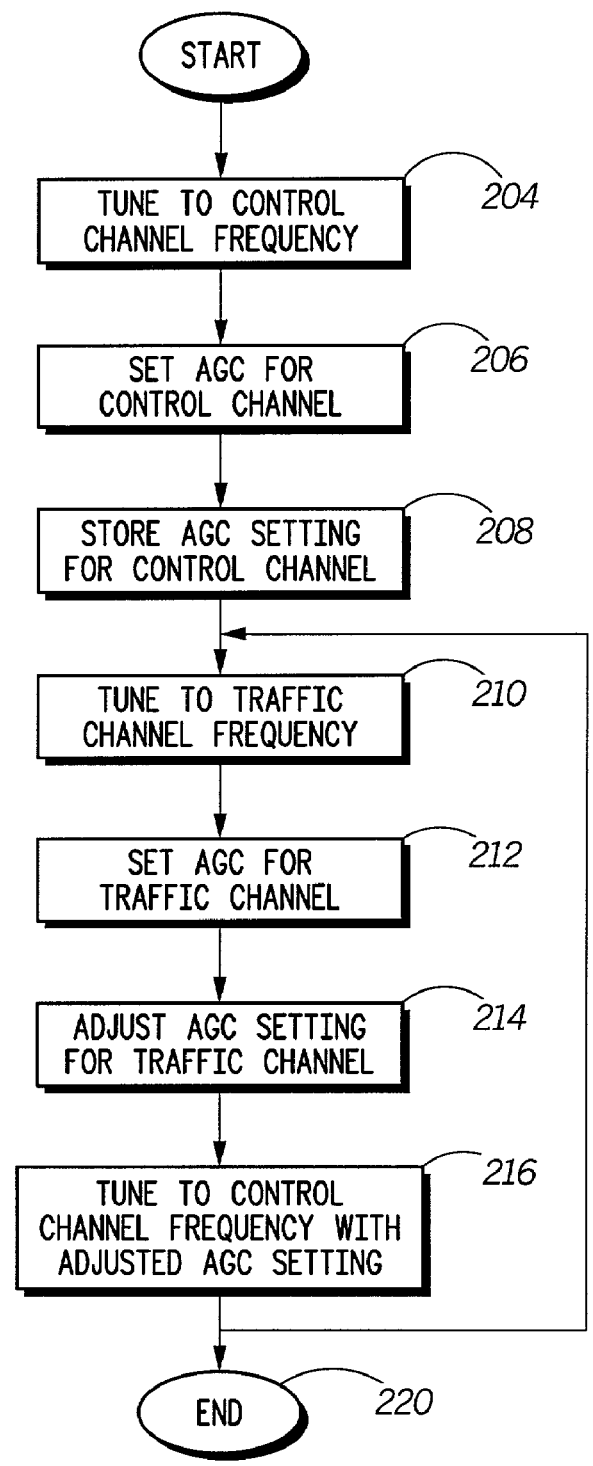
FIG. 2 shows a flow chart diagram of a method for maintaining AGC settings for multiple frequencies when only one frequency is monitored in a communication system, in accordance with the invention.

Referring now to FIG. 2, there is shown a flow chart diagram 200 of a method for maintaining AGC settings for multiple frequencies in a mobile communication device, in accordance with the invention. The method starts 202 when the mobile communication device is registered for communication service with a communication network over a base station. The mobile communication device first tunes to a control channel frequency (204) to receive control information, such as a frequency correction burst (FCB). An FCB is used by the mobile communication device to adjust its reference oscillator and maintain frequency precision. In the process of receiving information on the control channel, the mobile communication device adjusts the AGC setting for the control channel frequency (206). In the preferred embodiment the mobile communication device uses digital circuitry and digital to analog conversion to converts a digital value to a voltage level in the receive circuitry for controlling the attenuation or gain of the receiver, as is know in the art. The digital value is stored in a memory of the mobile communication device (208). Once the control information is received, the mobile communication device may then tune to a traffic channel in order to engage in a call, for example. This requires the mobile communication device to tune to a second frequency there the assigned traffic channel is located (210). After tuning the to traffic channel frequency, the mobile communication device performs AGC for this second frequency (212). The AGC setting for the traffic channel frequency is stored in memory. The AGC setting for the traffic and control channels may be different because they are different frequencies, so it is not practical to use the AGC setting of the control channel when tuning to the traffic channel frequency. It may be used as a starting point, but circumstances will often be such that it will need to be adjusted to properly receive information on the traffic channel. During a call, the AGC setting for receiving the traffic channel can vary as the mobile communication device moves closer to, or farther away from the base station, and when it connects to a new base station when the call is handed off. As a result, the mobile communication device adjusts the AGC setting (212) during the call. However, in accordance with the invention, the mobile communication device is provided with a means of tracking the change in AGC setting. There are a variety of ways to accomplish this. For example, the starting AGC setting can be stored, and the running value be stored in a separate memory location. This allows the mobile communication device at any given time to determine how much the AGC setting has changed while on the traffic channel. The intent of the invention is to adjust the AGC setting of the control channel so that the deviation of the control channel AGC setting is changed to a degree that corresponds with the degree of which the traffic channel AGC setting has changed (214), so that when the mobile communication device needs to access the control channel during a call (216), it will not miss information because the signal conditions have changed.

This problem is created by the fact that during a call the mobile communication device occasionally must receive a FCB. However, under the prior art method of performing this, some traffic information would be missed because the mobile communication device would have to take time to retune and reset the control channel AGC setting. Because the control channel and the received traffic channel are both transmitted from the same base station, they will have likely changed to the same degree. By adjusting the stored control channel AGC setting prior to returning to the control channel frequency, the returning is made simpler since the adjusted AGC setting will likely be very close to an optimum AGC setting, if not the same. If the mobile communication device is engaged in a call, after receiving the control information, the mobile communication device will retune to the traffic channel and commence receiving information there (218). Otherwise the mobile communication device will simply camp on the present control channel and wait for activity.

There fore the invention is a method of performing automatic gain correction in a mobile communication device for use in a communication system having a first channel on a first frequency and a second channel on a second frequency, the method comprises determining an automatic gain control (AGC) setting for the first channel (206) and storing the AGC setting for the first channel (208). The invention applies particularly when the mobile communication device is engaged in a call, so after setting the AGC for the first channel, the mobile communication device commences switching to the second channel (210), determining a first AGC setting for the second channel (212), and storing the first AGC setting for the second channel (212). While the mobile communication device is tuned to the second channel, the AGC may change, necessitating the mobile communication device determining a second AGC setting for the second channel (214). After a period of time the mobile communication device may need to receive information on the first channel, so the mobile communication device commences determining a difference between the first AGC setting for the second channel and the second AGC setting for the second channel (214), and applying the difference to the AGC setting for the first channel (214). This provides an adjusted AGC for the first channel, and the degree of adjustment corresponds to the degree of change the AGC setting for the second channel experienced while the mobile communication device was receiving information on the second channel. This allows the mobile communication device to commence switching to the first channel with the modified AGC setting so that information can be received on the first channel without having to reestablish the AGC setting for the first channel. In a typical communication system, the first channel is a control channel, and the second channel is a traffic channel. The AGC settings can be stored in a table in memory, with an AGC setting for each channel and an additional one for keeping track of the changes while engaged in calls, for example. When the mobile communication device initially switches to the second channel the initial AGC setting for the second channel can be the last AGC setting for the first channel. Conversely, the switching can be done without using the AGC setting for the first channel.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of performing automatic gain correction in a mobile communication device for use in a communication system having a first channel on a first frequency and a second channel on a second frequency, the method comprising:
    determining an automatic gain control (AGC) setting for the first channel;
    storing the AGC setting for the first channel;
    switching to the second channel;
    determining a first AGC setting for the second channel;
    storing the first AGC setting for the second channel;
    after a period of time, determining a second AGC setting for the second channel;
    determining a difference between the first AGC setting for the second channel and the second AGC setting for the second channel;
    applying the difference to the AGC setting for the first channel to produce a modified AGC setting; and
    switching to the first channel with the modified AGC setting.

2. A method of performing AGC as defined in claim 1, wherein the first channel is a control channel.

3. A method of performing AGC as defined in claim 1, wherein the second channel is a traffic channel.

4. A method of performing AGC as defined in claim 1, wherein the storing is performed by storing the AGC setting in a table.

5. A method of performing AGC as defined in claim 1 wherein the determining the first AGC setting for the second channel is done by using the AGC setting for the first channel.

6. A method of performing AGC as defined in claim 1 wherein the determining the first AGC setting for the second channel is done without using the AGC setting for the first channel.

* * * * *